(12) United States Patent
Gater

(10) Patent No.: US 6,762,627 B1
(45) Date of Patent: Jul. 13, 2004

(54) SWITCHED CAPACITOR PEAK DETECTOR WITH VARIABLE TIME CONSTANT ASYMMETRICAL FILTERING

(75) Inventor: Christian Gater, Dunblane (GB)

(73) Assignee: Micrel, Incorporated, San Jose, CA (US)

(*) Notice: Subject to any disclaimer, the term of this patent is extended or adjusted under 35 U.S.C. 154(b) by 0 days.

(21) Appl. No.: 10/404,936

(22) Filed: Mar. 31, 2003

(51) Int. Cl.[7] .............................................. G01R 19/00
(52) U.S. Cl. ............................ 327/58; 327/61; 327/94; 327/337
(58) Field of Search .......................... 327/58, 61, 62, 327/91, 94, 330, 337, 343, 50–52, 56, 59, 60, 63, 69, 70; 341/122

(56) References Cited

U.S. PATENT DOCUMENTS

| | | | | |
|---|---|---|---|---|
| 4,603,299 A | | 7/1986 | Monett ........................ 328/151 |
| 4,845,383 A | * | 7/1989 | Iida ............................ 327/91 |
| 5,170,075 A | * | 12/1992 | de Wit ........................ 327/93 |
| 5,302,863 A | | 4/1994 | Walley et al. ............... 307/351 |
| 5,481,212 A | * | 1/1996 | Shima ........................ 327/94 |
| 5,717,349 A | * | 2/1998 | Bortot et al. ................. 327/58 |
| 5,801,552 A | * | 9/1998 | Moore ........................ 327/62 |
| 5,804,993 A | * | 9/1998 | Suzuki ........................ 327/58 |
| 6,064,238 A | * | 5/2000 | Wight et al. ................. 327/58 |
| 6,204,727 B1 | * | 3/2001 | Wey et al. ................... 329/370 |
| 6,208,173 B1 | * | 3/2001 | Redman-White ............ 327/59 |
| 6,249,154 B1 | * | 6/2001 | Jouffre et al. ............... 327/91 |
| 6,489,812 B1 | | 12/2002 | Savard et al. ................. 327/59 |
| 6,542,009 B2 | * | 4/2003 | Maruyama ................... 327/59 |
| 6,597,228 B1 | * | 7/2003 | Reichel ....................... 327/330 |
| 6,628,146 B2 | * | 9/2003 | Tam ............................ 327/63 |

* cited by examiner

Primary Examiner—Timothy P. Callahan
Assistant Examiner—Hai L. Nguyen
(74) Attorney, Agent, or Firm—Patent Law Group LLP; Carmen C. Cook

(57) ABSTRACT

A peak detector employs switched capacitor filtering to implement long time constant and variable attack and decay characteristics. In one embodiment, the peak detector includes a first switch, a rectifier, a first capacitor and a second switch in the attack path, and a third switch, a second capacitor and a fourth switch in the decay path. The peak detector further includes a third capacitor coupled to the attack and decay paths and having a capacitance greater than the capacitance of the first and second capacitors. In operation, the attack path is activated by alternately closing the first and second switches to sample the input signal and generate an output voltage at the third capacitor indicative of the peak voltage value of the input signal. The second circuit path is activated by alternately closing the third and fourth switches to decrease the output voltage at the third capacitor.

29 Claims, 3 Drawing Sheets

SWITCHED CAPACITOR PEAK DETECTOR WITH VARIABLE TIME CONSTANT ASYMMETRICAL FILTERING

FIELD OF THE INVENTION

The invention relates to peak detectors and, in particular, to peak detectors for detecting and filtering the peak value of a generally arbitrary signal waveform in the presence of noise.

DESCRIPTION OF THE RELATED ART

In integrated circuit radio frequency (RF) receivers employing pulsed ON-OFF RF amplitude signaling (also referred to as ON-OFF Keyed or OOK signaling), the received signal must be detected in the presence of noise in the communication channel. FIG. 1 illustrates waveforms of a signal being modulated for transmission on a communication channel. Referring to FIG. 1, signal waveform 10 denotes the data to be transmitted (TX data) as a series of zero's and one's. When OOK signaling is used to transmit the data, the amplitude of the RF carrier signal is modulated by the TX data which has the result of turning off the RF carrier signal when the data is a "zero" value and turning on the RF carrier signal when the data is a "one" value. The transmitted signal is illustrated by signal waveform 12. The noise presence in the communication channel is depicted by signal waveform 14 which noise is superimposed on the transmitted signal during transmission. The result is that the signal received by a receiver (signal waveform 16) contains the transmitted signal distorted by noise.

To decode the data contained in the received signal, the receiver must discriminate between the strength of the received signal in the presence of background noise. Generally, the receiver needs to detect the amplitude of the received signal including the noise component and determine when a data signal is present. Methods for detecting an OOK modulated signal are known and generally involve detecting the peak value of the received signal over a defined time period. By comparing changes in the peak value of the received signal, it is possible to identify when a valid signal has been received.

To improve the likelihood of detecting a valid signal, filtering techniques are generally used with the peak detector to mitigate the effects of background noise. To make filtering effective, all a priori knowledge of the transmitted signal must be used to design the filter for optimum system performance. FIGS. 2 and 3 illustrate two examples where different filter characteristics are employed to detect the received signal.

FIG. 2 illustrates the signal waveforms of transmitted and received signals where the goal is to recover data transmitted in OOK format. In this case, the time constant of the filter used in the receiver is designed to have equal attack and decay characteristics so that the filter responds to the signal content at the transmitted data rate but rejects spurious noise. Filtered signal 22 depicts the signal waveform recovered from the received signal 20 where the content of the transmitted data (signal 18) is correctly identified.

FIG. 3 illustrates the signal waveforms of transmitted and received signals where the filter of the receiver is intended to help identify which receive channel should be selected to recover transmitted data from. That is, the detector is operating as a signal detector only. In this case, the filter in the receiver should be designed to have a faster attack characteristic and a slower decay characteristic since the data pattern may not be repetitive, that is, the transmitted data may have unequal mark-space ratios. A fast-attack-slow-decay filter characteristic helps to select and hold the correct receive channel provided the transmitted data is of sufficient mark-space ratio for the chosen filter decay characteristic. As shown in FIG. 3, the filtered signal 28 identifies the receive channel of the transmitted data 24 when transmitted data 24 has unequal mark-space ratios. The two examples shown in FIGS. 2 and 3 demonstrate that different applications require different filter characteristics associated with the peak detect circuitry.

Conventional peak detectors in integrated circuits are usually built using linear filters and have several disadvantages. For example, large time constant linear filters require very small currents, large resistors and large capacitors which consume too much chip area in integrated circuits, thereby increasing cost and lowering yield. Also, it is difficult to provide linear filters which can be programmed for different filter characteristics without consuming large chip area using redundant switchable circuitry. Finally, linear filter performance often suffers from operational temperature and voltage variation or fabrication process drift so that large variation in filter characteristics may result from the use of linear filters.

FIG. 4 illustrates a conventional peak detector circuit. Peak detector 30 includes a diode D receiving the input signal to be processed. Diode D rectifies the input signal and the peak value (Vpk) of the rectified input signal is stored on a capacitor Cap. A resistor Rdecay is coupled to the peak voltage node to provide a decay path to discharge capacitor Cap and reset the peak voltage value when needed. Typically, additional filtering functions are provided to smooth out the Vpk signal, such as by using an RC filter network. The output signal is thus a filtered version of the Vpk signal. When a more controlled attack characteristic is desired, a current can be switched through diode D to limit the attack of the Vpk signal. Other conventional peak detector structures may include active gain stages but nonetheless follows the basic principle of peak detector 30 of FIG. 4.

The conventional peak detectors, such as peak detector 30, have several disadvantages. First, the attack and decay characteristics of the peak detector are determined by the discrete time constants of the resistors and the capacitors in the circuit. Because the electrical characteristics of the resistors and capacitors can vary with the fabrication process and the operating temperature, the charge and discharge rate of capacitor Cap can vary as a result which adversely affects the detector performance. Second, when the conventional peak detector is constructed as an integrated circuit, it is not practical to implement long time constants due to the large physical size of the capacitors and resistors or the noise level associated with operating the peak detector at extremely low current levels. Lastly, it is difficult to change the attack and decay characteristics in the conventional peak detector structure because doing so will consume more silicon real estate in an integrated circuit as multiple redundant devices are required. Thus, the manufacturing cost for the detector will increase while the yield may suffer.

Therefore, it is desirable to provide a peak detector which avoids the shortcomings of the conventional peak detector and it is further desirable to provide a peak detector whereby the attack and decay characteristics can be adjusted without requiring large increase in silicon area.

SUMMARY OF THE INVENTION

According to one embodiment of the present invention, a peak detector for detecting a peak voltage value of an input signal includes a first switch coupled to receive the input signal and selectively coupling the input signal to an input rectifier where the input rectifier generates a rectified input signal on a first node, a first charge storage device coupled between the first node and a ground node for storing a peak voltage value of the rectified input signal, and a second switch coupled between the first node and a second node for selectively coupling the first charge storage device to the second node. The peak detector further includes a third switch coupled between a reference potential and a second charge storage device for selectively discharging the second charge storage device to the reference potential, a fourth switch coupled between the second charge storage device and the second node, and a third charge storage device coupled between the second node and the ground node where the third charge storage device has a charge storage capability greater than that of the first and second charge storage devices. In operation, the first switch and the second switch are alternately closed to sample the input signal and generate an output voltage at the second node indicative of the peak voltage value of the input signal. Furthermore, the third switch and the fourth switch are alternately closed to decrease the output voltage at the second node.

According to one aspect of the present invention, the charge storage devices are capacitors. The peak detector of the present invention can implement asymmetrical attack and decay characteristics by selecting the appropriate capacitor ratios of the capacitors or by selecting the appropriate switching rates of the switches.

The present invention is better understood upon consideration of the detailed description below and the accompanying drawings.

BRIEF DESCRIPTION OF THE DRAWINGS

FIG. 3 illustrates signal waveforms of transmitted and received signals where the filter of the receiver is intended to help identify which receive channel should be selected to recover transmitted data from.

DETAILED DESCRIPTION OF THE PREFERRED EMBODIMENTS

In accordance with the principles of the present invention, a peak detector employs switched capacitor filtering to implement long time constant and variable attack and decay characteristics. Specifically, the time constant of the peak detector can be varied by altering the ratio of the capacitors in the peak detector or the switching rate of the switched capacitor circuit. Similarly, asymmetrical filtering characteristics or asymmetrical attack and decay characteristics can be realized by changing the capacitor ratios or changing the switching rate of the switched capacitor circuit.

The peak detector of the present invention can be used in any application requiring the detection and filtering of the peak value of a generally arbitrary signal waveform in the presence of noise. In particular, the peak detector of the present invention is suited for detecting carrier presence in ON-OFF-Keyed (OOK) RF integrated circuit receivers where small physical size is important.

Figure 5:
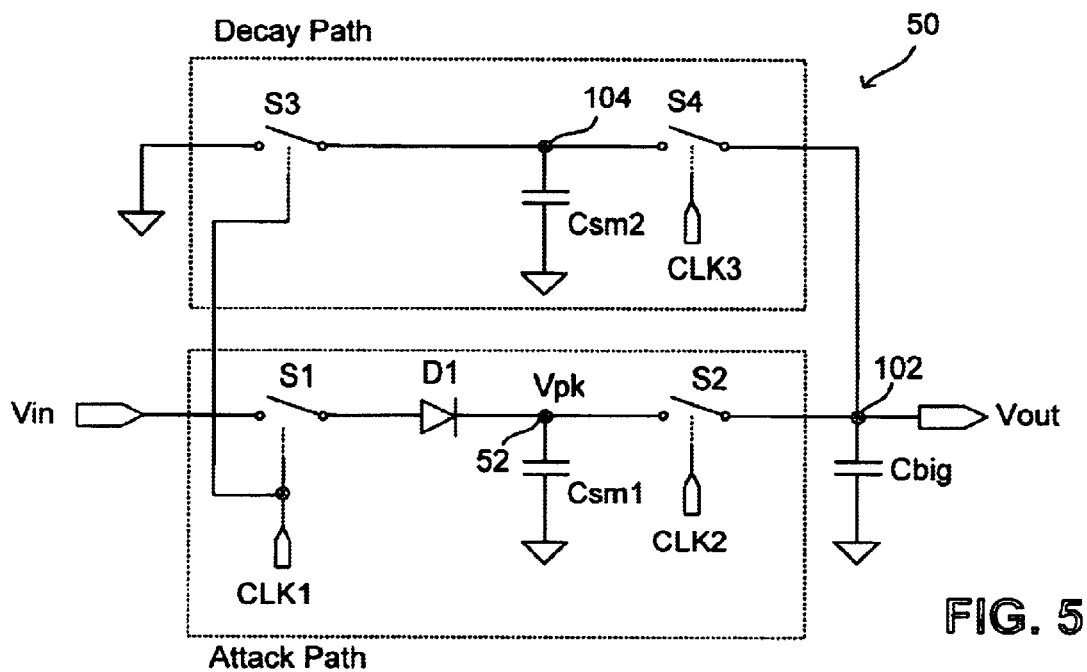
FIG. 5 is a circuit diagram of a switched capacitor peak detector according to one embodiment of the present invention.

FIG. 5 is a circuit diagram of a switched capacitor peak detector according to one embodiment of the present invention. Referring to FIG. 5, peak detector 50 includes a switch S1 receiving an input voltage signal Vin and a diode D1 coupled to switch S1 to rectify the input voltage signal. Switch S1 operates to selectively sample the input voltage signal Vin. The peak voltage value Vpk of the rectified input voltage signal is stored on a capacitor Csm1 coupled between the peak voltage node 52 and the ground node. A second switch S2 selectively redistributes the charge stored on capacitor Csm1 between capacitors Csm1 and Cbig. The output voltage Vout (node 102) of peak detector 50 is the voltage across capacitor Cbig. In peak detector 50, capacitor Csm1 has a capacitance value that is smaller than capacitor Cbig. Switch S1, diode D1, capacitor Csm1, switch S2 and capacitor Cbig form the attack path of peak detector 50. As will be explained in more detail below, when switch S2 is closed, the charge stored on capacitor Csm1, representing the currently sampled peak voltage value Vpk, is transferred to capacitor Cbig having a much bigger capacitance. The sampling and charge transfer operations are repeated over a sampling period so that output voltage Vout reaches a value indicative of the peak voltage value of the input voltage signal Vin. By transferring charge from a small capacitor Csm1 to a big capacitor Cbig, filtering of the peak voltage signal is also accomplished.

Peak detector 50 further includes a switch S3 selectively coupling a node 104 to the ground node, a capacitor Csm2 coupled between node 104 and the ground node, and another switch S4 selectively coupling capacitor Csm2 to the output voltage node 102. Capacitor Csm2 has a capacitance value that is smaller than capacitor Cbig. Switch S3, capacitor Csm2, switch S4 and capacitor Cbig form the decay path of peak detector 50. As will be explained in detail below, whenever switch S4 is closed, part of the charge stored in capacitor Cbig is transferred to capacitor Csm2 to allow the output voltage Vout of peak detector 50 to decay towards zero.

Figure 6:
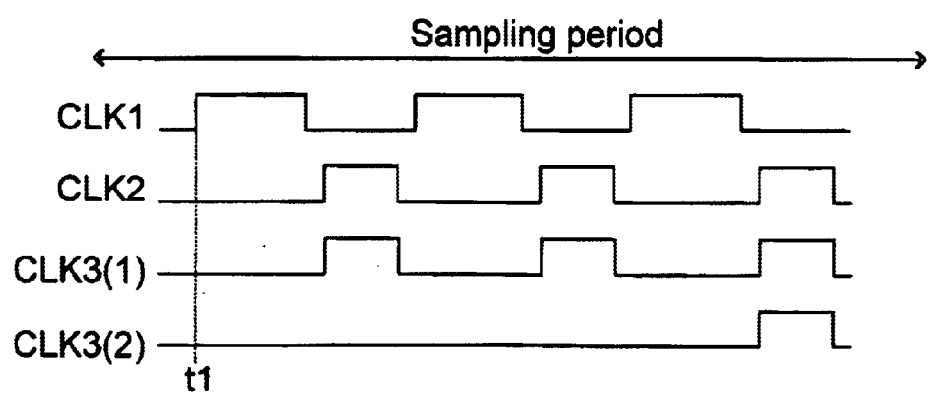
FIG. 6 illustrates clock signal waveforms for operating the peak detector of FIG. 5 according to one embodiment of the present invention.

In peak detector 50, switch S1 and switch S3 are driven by a clock signal CLK1 while switch S2 is driven by a clock signal CLK2. Switch S4 is driven by a clock signal CLK3 which is either the same as clock CLK2 or a derivative of clock CLK2. The switches in peak detector 50 are driven by a non-overlapping clocking scheme. FIG. 6 illustrates a representative clocking scheme that can be used to operate peak detector 50 of the present invention. Of course, one of ordinary skill in the art would appreciate that other non-overlapping clocking schemes can also be used depending on the applications. The operation of peak detector 50 using the clocking scheme of FIG. 6 will be described in detail below.

In one embodiment, peak detector 50 is built in an integrated circuit using CMOS fabrication process. Capacitors Csm1, Csm2, and Cbig can be built using polysilicon capacitors or MOS capacitors or other capacitor structures well known in the art. Also, switches S1 to S4 can be implemented as MOS transistor switches as is well known in the art.

In accordance with the present invention, peak detector 50 employs switched capacitor filtering to realize long time constants and variable attack and decay characteristics. Unlike conventional switched capacitor filtering techniques that employ oversampling of the input signal (that is, sampling the input signal at a frequency much higher than the input signal frequency), the peak detector of the present invention employs undersampling using a switch (S1), a diode (D1) and a sampling capacitor (Csm1) to implement the peak detect operation. By operating switch S1 such that the sampling period exceeds the minimum input signal period, sampling capacitor Csm1 will store the peak value of the input signal over the sampling period.

After the peak voltage value is sampled and stored on capacitor Csm1, peak detector 50 implements filtering of the peak voltage value Vpk by transferring the sampled charge stored on sample capacitor Csm1 onto a larger capacitor Cbig. The sampling and charge transfer operations are repeated to set the attack rate of the filtering operation. In accordance with the present invention, the attack rate of peak detector 50 can be adjusted by changing the capacitor ratio of capacitors Csm1 and Cbig or changing the sampling rate (or switching rate) of switches S1 and S2. The slower the attack rate is set, the more immune the peak detector is to high frequency noise that can swamp other conventional peak detectors.

The decay operation in peak detector 50 is controlled by removing a small amount of charge from the large capacitor Cbig onto a much smaller capacitor Csm2, thereby stepping down the output voltage Vout. The decay characteristic can be adjusted by changing the capacitor ratio of capacitors Cbig and Csm2 or the sampling rate of switches S3 and S4.

When the switched capacitor peak detector of the present invention is implemented as an integrated circuit, the peak detector can implement adjustable filtering characteristic without requiring excessive silicon area as the sampling frequencies can be kept low and the capacitor sizes can be kept small. This is because the filtering characteristics of the peak detector of the present invention are determined by the capacitor ratio or by the sampling rate, rather than by the size of the capacitors. Furthermore, the peak detector of the present invention is also insensitive to temperature and process variation and can be used over a very wide range of input frequencies.

Figure 1:
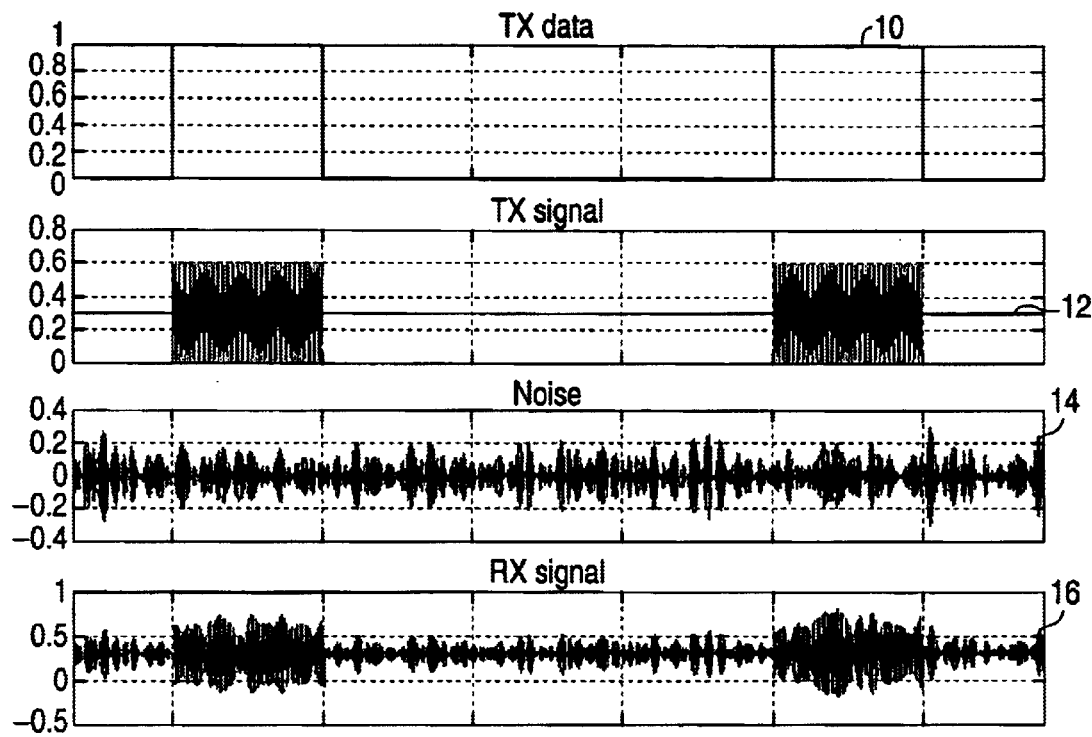
FIG. 1 illustrates waveforms of a signal being modulated for transmission on a communication channel.
Figure 2:
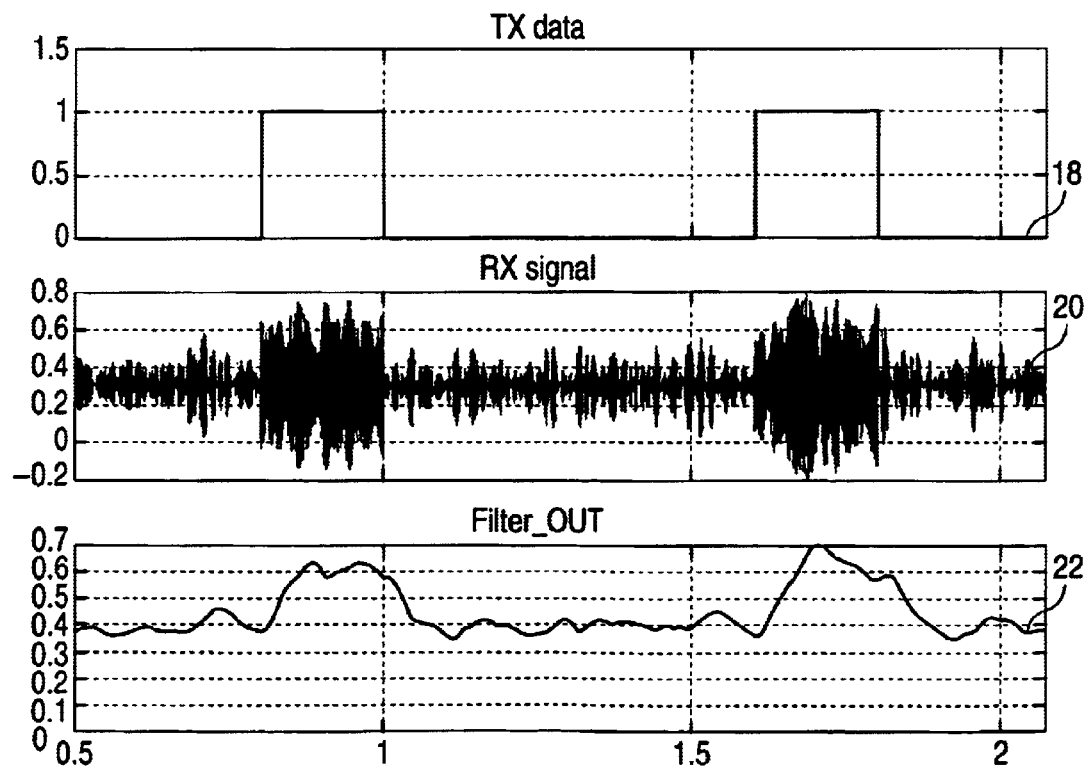
FIG. 2 illustrates signal waveforms of transmitted and received signals where the goal is to recover data transmitted in OOK format.

In one embodiment, when peak detector 50 is designed for data detection and symmetrical attack and decay characteristics are desired, as in the case illustrated in FIG. 2, the following capacitor ratios and clock switching rates can be used:

Csm1:Cbig=1:20;

Csm2:Cbig=1:40;

Clock CLK1 frequency=100 kHz;

Clock CLK2 frequency=100 kHz; and

Clock CLK3 frequency=100 kHz.

Figure 3:
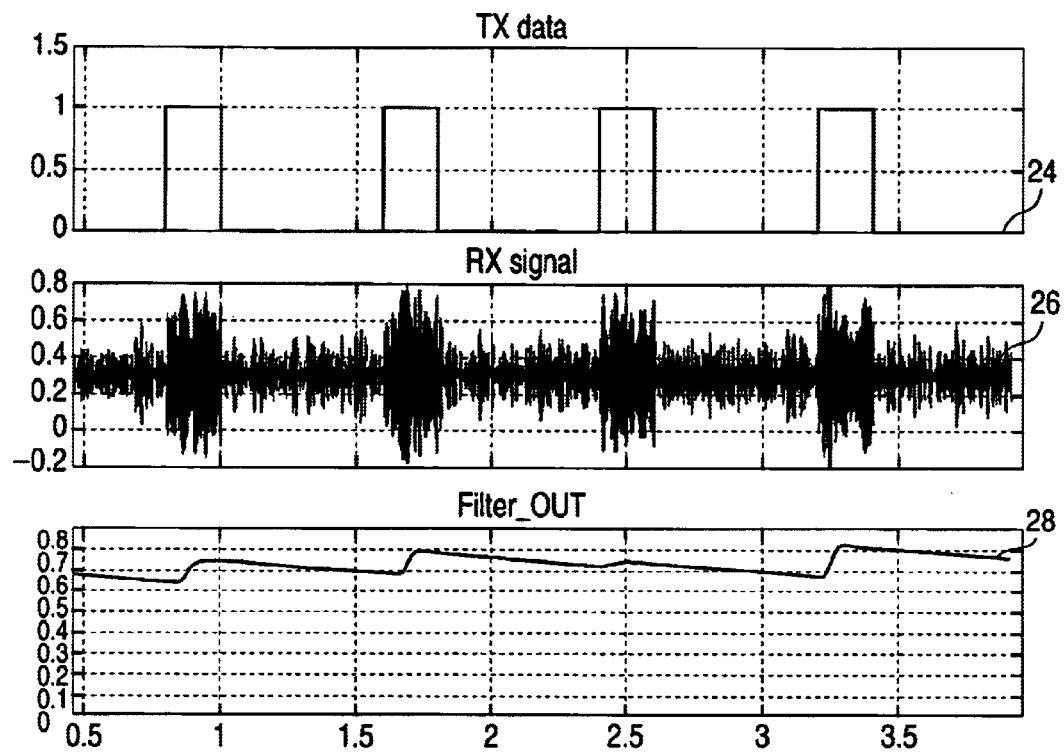

In an alternate embodiment, when peak detector 50 is designed for signal detection and a slow decay characteristic is desired, as in the case illustrated in FIG. 3, the following capacitor ratios and clock switching rates can be used:

Csm1:Cbig=1:20;

Csm2:Cbig=1:100;

Clock CLK1 frequency=100 kHz;

Clock CLK2 frequency=100 kHz; and

Clock CLK3 frequency=100 kHz with optional missing pulses.

The operation of peak detector 50 under the timing control of the clock signals in FIG. 6 will now be described. Note that FIG. 6 illustrates two instances of clock signal CLK3 both of which can be used in operating switch S4, as will be described in more detail below. FIG. 6 illustrates three representative sample cycles within a sampling period of an input voltage signal. In accordance with the present invention, the sample period is set to be long enough to guarantee detection of the expected peak of a repetitive input waveform. For example, if the expected input signal period is 1 μs, the sampling period should be greater than 1 μs.

At time t1 which is the start of a given sample cycle within a sampling period, the decay path is disconnected as a result of clock CLK3 being at a "low" value causing switch S4 to be open. On the other hand, switch S3, under the control of clock CLK1, is closed thereby discharging capacitor Csm2. Switch S1 is closed in response to clock CLK1 and the input voltage signal Vin is sampled in the attack path of peak detector 50. Specifically, input voltage signal Vin is rectified by diode D1 and the peak voltage value of the input voltage signal is sampled and stored on capacitor Csm1.

When the peak voltage sampling operation is completed, clock CLK1 is deasserted to open switch S1 and clock CLK2 is asserted shortly thereafter. When switch S2 is closed in response to clock CLK2, peak detector 50 transfers charge stored on capacitor Csm1 onto large capacitor Cbig. If capacitor Cbig is much greater than capacitor Csm1 and voltage Vpk is greater than voltage Vout(N), the output voltage Vout at node 102 can be approximated as:

$$\text{Vout}(N+1)=\text{Vout}(N)+\text{Vpk}*(\text{Csm1}/\text{Cbig}) \quad (1)$$

where N represents the number of the sample cycle. From Equation (1), it can be seen that output voltage Vout will try to ramp up to the peak voltage Vpk but the attack rate of output voltage Vout is controlled by the ratio of capacitors Csm1 and Cbig and the clock switching rate of switches S1 and S2. In other words, the attack slew rate is proportional to (sampling frequency of switches S1 and S2)*(Csm1/Cbig). To realize a faster attack rate, a larger Csm1/Cbig ratio can be used or a faster sampling rate for switches S1 and S2 can be used. Note that voltage Vout will eventually saturate at the Vpk voltage unless a decay path is provided.

The decay operation of peak detector 50 is now considered. As mentioned above, during the peak detect operation when clock CLK1 is asserted, switch S3 is closed to discharge capacitor Csm2 to a low voltage, such as the ground voltage as illustrated in FIG. 5. Then, when clock CLK3 is asserted, switch S4 is closed and a small amount of charge is transferred from capacitor Cbig reducing the value of output voltage Vout. Clock CLK3 can be the same signal as clock CLK2 (as illustrated by CLK3 (1) in FIG. 6) or it can be a signal derived from clock CLK2. For example, clock CLK3 can be asserted for only 1 out of M pulses of clock CLK2, as illustrated by CLK3 (2) in FIG. 6. When CLK3 (2) signal is used, switch S4 is closed only once for every M times switch S2 is closed. Thus, capacitor Cbig is discharged only once for every M times the capacitor is charged by sample capacitor Csm1. In this manner, the discharge rate of capacitor Cbig can be controlled either by the capacitor ratio between capacitor Csm2 and capacitor Cbig or by the clock switching patterns of switches S3 and S4.

In the decay operation, every time switch S4 is closed, a small amount of charge is removed from capacitor Cbig which lowers the value of output voltage Vout. As mentioned above, the decay rate can be controlled by selecting the capacitor ratio of capacitors Csm2/Cbig or by selecting the rate at which switches S3 and S4 are closed. In other words, the decay slew rate is proportional to (sampling frequency of switches S3 and S4)*(Csm2/Cbig). When clock CLK3 is asserted only once for every M pulses of clock CLK2, the decay slew rate is also proportional to 1/M. That is, the more CLK2 pulses where switch S4 remains open, the slower the decay characteristics. Thus, a very slow decay rate can be achieved by asserting clock CLK3 to close switch S4 only once for every M closures of switch S2 where M is greater than 1.

On the other hand, when a faster decay rate is desired, clock CLK3 can be asserted whenever clock CLK2 is asserted. In that case, switches S2 and S4 are both closed at the same time and capacitor Csm1 transfers charges to capacitor Cbig at the same time capacitor Csm2 removes charges from capacitor Cbig. However, because capacitor Csm2 is designed to be smaller than capacitor Csm1 in most applications and because when the input voltage is at a "high" logical value, the voltage at capacitor Csm1 is much greater than the voltage at capacitor Csm2, the amount of charge transferred from capacitor Cbig onto capacitor Csm2 is smaller than the charge transferred from capacitor Csm1 to capacitor Cbig so that the output voltage will continue to track the peak voltage value of the input voltage signal.

The peak detector of the present invention can be applied in various applications for detecting the peak value of an input voltage signal. In most cases, circuitry in a RF receiver receives an incoming RF signal and processes the incoming signal to recover the transmitted signal contained therein. The recovered signal can then be supplied to the peak detector of the present invention as the input voltage signal for detection of the peak voltage value.

Figure 7:
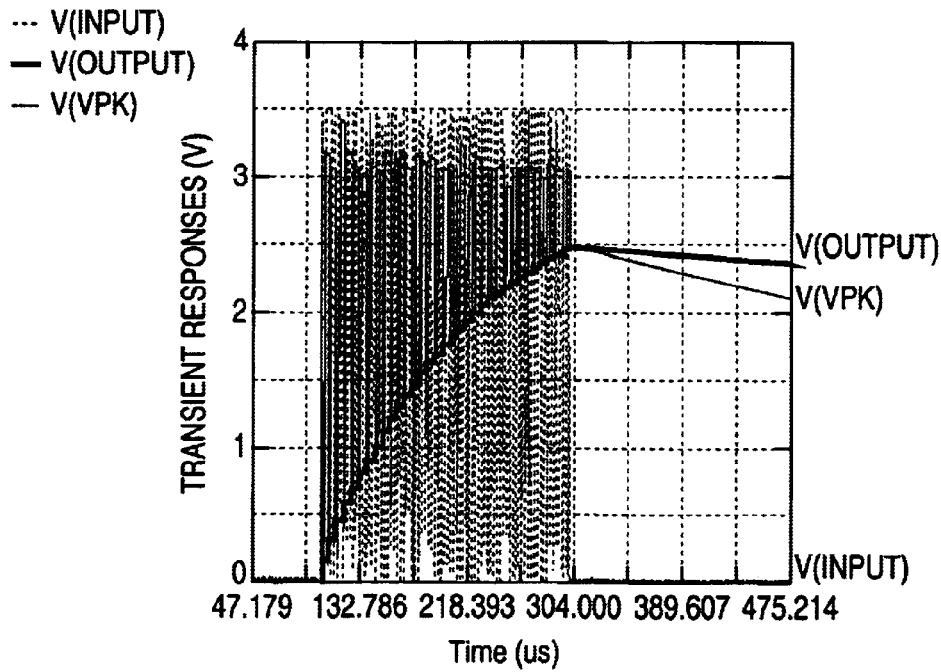
FIG. 7 includes simulated signal waveforms illustrating the operation of the peak detector of FIG. 5 for detecting the peak voltage value of an input voltage signal.
Figure 4:
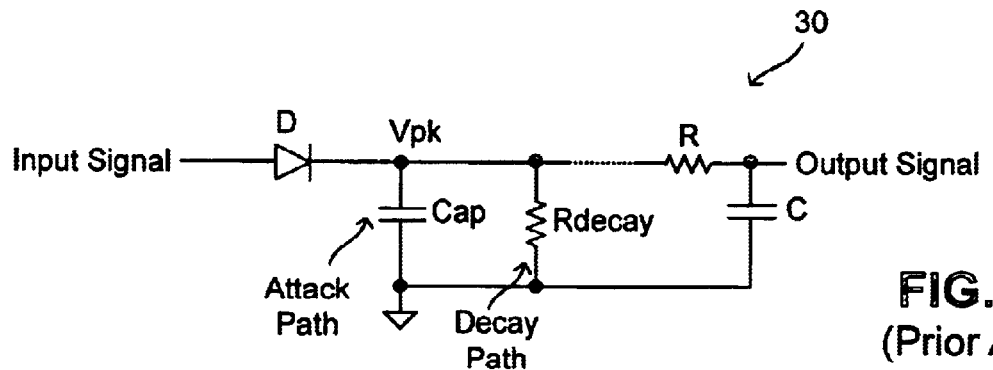
FIG. 4 illustrates a conventional peak detector circuit.

FIG. 7 includes simulated signal waveforms illustrating the operation of peak detector 50 for detecting the peak voltage value of an input voltage signal. In the present illustration, the input signal "V(INPUT)" is represented as a burst of OOK RF signal, which input signal has been recovered from the raw RF input signal by circuitry in a receiver prior to the peak detector of the present invention. At each sample cycle within the sampling period, the peak voltage of the input signal is sampled through switch S1 and diode D1 and stored on capacitor Csm1. As shown in FIG. 7, the peak voltage signal Vpk (V(VPK)) follows the peak voltage value of the input signal. Note that the peak voltage V(VPK) is lower than the absolute peak voltage value of the input signal V(INPUT) because of the diode voltage drop across diode D1. This voltage drop could be eliminated by using other commonly known rectifier techniques.

At each sample cycle, the peak voltage is sampled and stored on capacitor Csm1. Then switch S1 is open and switch S2 is closed to transfer the charge stored on capacitor Csm1 onto capacitor Cbig. Therefore, at each sample cycle, the output voltage V(OUTPUT) increases as more and more charge sampled by capacitor Csm1 is transferred onto capacitor Cbig. Note that whenever switch S2 is closed, capacitors Csm1 and Cbig are connected in parallel and the voltage across them must be equal. Thus, when switch S2 is closed, some of the charge stored on capacitor Csm1 is transferred onto capacitor Cbig and the peak voltage value Vpk at capacitor Csm1 decreased down to the output voltage value V(OUTPUT). However, when the next sample cycle begins and switch S2 is open and switch S1 is closed, the peak voltage V(VPK) increases up to the peak voltage value of V(INPUT) again by the action of sampling the input signal and charging capacitor Csm1.

At the end of a sampling period, the final value of the output voltage V(OUTPUT) is established. The waveform V(OUTPUT) in FIG. 7 demonstrates that peak detector 50 has successfully identified a "high" logical value in the input signal. In FIG. 7, the voltage Vpk dropped below voltage V(output) after the sampling period is merely a facet of the simulation and leakage associated with the diode model used during simulation. In actual operation, voltage Vpk remains at the same voltage level as voltage V(OUTPUT) at the end of the sampling period.

The peak detector of the present invention provides many advantages. First, the peak detector of the present invention is based on switched capacitor techniques and relies on undersampling of the input signal for peak detection. In most application of switch capacitor techniques for sampling an input signal, oversampling is used. The peak detector of the present invention is novel in its use of undersampling for the purpose of peak detection. Because of the use of undersampling, the peak detector of the present invention is by nature a non-linear system and susceptible to the commonly understood effects of aliasing. However, as long as the aliasing effects are understood in the application, these effects will not adversely affect the applicability of the peak detector of the present invention.

Second, the peak detector of the present invention is novel also in its ability to provide asymmetrical filtering by choice of capacitor ratio or sampling rate (switching rate) of the switches. The selection of appropriate capacitor ratio or sampling rate enables a degree of noise filtering to be achieved without the need for long time constant linear filters that consume large areas of an integrated circuit.

Lastly, the switched capacitor peak detector of the present invention enables a receiver system to adapt the peak detector operating characteristics in a programmable manner without requiring excessive use of multiple redundant circuitries. Specifically, the operating characteristics of the peak detector can be programmable by switching in different capacitor ratios or switching in different sampling frequencies of the switches. Therefore, the peak detector of the present invention provides flexibility without requiring excessive silicon area to implement.

The above detailed descriptions are provided to illustrate specific embodiments of the present invention and are not intended to be limiting. Numerous modifications and variations within the scope of the present invention are possible. For example, the peak detector of the present invention utilizes a switched capacitor topology. The commonly understood practices for switched capacitor design should be employed to mitigate the unwanted effects of switching parasitics (such as charge feedthrough, substrate capacitance, capacitor and switch mismatch, and amplifier non-idealities). Techniques for handling unwanted effects of switching parasitics in switched capacitor design are well known in the art and any of the convention techniques can be applied to the peak detector circuit of the present invention without deviating from the scope of the present invention. Furthermore, in the above embodiment, diode D1 is used as a rectifier for rectifying the input voltage signal and capacitors Csm1, Csm2 and Cbig are used as charge storage devices. In other embodiments, other rectifier circuit elements or other charge storage devices with the appropriate charge storage capabilities can also be used. The present invention is defined by the appended claims.

I claim:

1. A peak detector for detecting a peak voltage value of an input signal, comprising:

a first switch coupled to receive the input signal and selectively coupling the input signal to an input rectifier, the input rectifier generating a rectified input signal on a first node;

a first charge storage device coupled between the first node and a ground node for storing a peak voltage value of the rectified input signal;

a second switch coupled between the first node and a second node for selectively coupling the first charge storage device to the second node;

a third switch coupled between a reference potential and a second charge storage device for selectively discharging the second charge storage device to the reference potential;

a fourth switch coupled between the second charge storage device and the second node; and a third charge storage device coupled between the second node and the ground node, the third charge storage device having a charge storage capability greater than that of the first and second charge storage devices;

wherein the first switch and the second switch are alternately closed to sample the input signal and generate an output voltage at the second node indicative of the peak voltage value of the input signal, and wherein the third switch and the fourth switch are alternately closed to decrease the output voltage at the second node.

2. The peak detector of claim 1, wherein a ratio of the charge storage capability of the first charge storage device to the third charge storage device establishes an attack rate of the peak detector for detecting the peak voltage value of the input signal.

3. The peak detector of claim 1, wherein a ratio of the charge storage capability of the second charge storage device to the third charge storage device establishes a decay rate of the peak detector for decreasing the output voltage of the peak detector.

4. The peak detector of claim 1, wherein the first charge storage device stores charge thereon as a result of sampling of the input signal using the first switch and the second switch is closed to redistribute the charge between the first charge storage device and the third charge storage device.

5. The peak detector of claim 1, wherein the first switch and the third switch are controlled by a first clock signal, the second switch is controlled by a second clock signal and the fourth switch is controlled by a third clock signal, the first, second and third clock signals being non-overlapping clock signals.

6. The peak detector of claim 5, wherein a frequency of the first clock signal and a frequency of the second clock signal establish an attack rate of the peak detector for detecting the peak voltage value of the input signal.

7. The peak detector of claim 5, wherein a frequency of the first clock signal and a frequency of the third clock signal establish a decay rate of the peak detector for decreasing the output voltage of the peak detector.

8. The peak detector of claim 5, wherein the third clock signal is the same as the second clock signal.

9. The peak detector of claim 5, wherein the third clock signal is asserted once for every M pulses of the second clock signal, where M is greater than 1.

10. The peak detector of claim 1, wherein the first, second and third charge storage devices comprise a first capacitor, a second capacitor, and a third capacitor, respectively, the capacitance of the third capacitor being greater than the capacitance of the first and second capacitors.

11. The peak detector of claim 10, wherein a ratio of the capacitance of the first capacitor to the third capacitor establishes an attack rate of the peak detector for detecting the peak voltage value of the input signal.

12. The peak detector of claim 1, wherein a ratio of the capacitance of the second capacitor to the third capacitor establishes a decay rate of the peak detector for decreasing the output voltage of the peak detector.

13. The peak detector of claim 1, wherein the input rectifier comprises a diode.

14. The peak detector of claim 1, wherein the reference potential is the ground potential at the ground node.

15. A peak detector for detecting a peak voltage value of an input signal, comprising:

a first circuit path comprising:
   a first switch coupled to receive the input signal;
   a diode coupled to the first switch for generating a rectified input signal on a first node;
   a first capacitor coupled between the first node and a ground node, the first capacitor storing a peak voltage value of the rectified input signal; and
   a second switch coupled between the first node and a second node for selectively coupling the first capacitor to the second node;

a second circuit path comprising:
   a third switch coupled between a reference potential and a third node;
   a second capacitor coupled between the third node and the ground node; and
   a fourth switch coupled between the third node and the second node; and a third capacitor coupled between the second node and the ground node, the third capacitor having a capacitance greater than that of the first and second capacitors;

wherein the first circuit path is activated by alternately closing the first switch and the second switch to sample the input signal and generate an output voltage at the second node indicative of the peak voltage value of the input signal, and wherein the second circuit path is activated by alternately closing the third switch and the fourth switch to decrease the output voltage at the second node.

16. The peak detector of claim 15, wherein the first capacitor stores charge thereon as a result of sampling of the input signal using the first switch and the second switch is closed to redistribute the charge between the first capacitor and the third capacitor.

17. The peak detector of claim 15, wherein the first switch and the third switch are controlled by a first clock signal, the second switch is controlled by a second clock signal and the fourth switch is controlled by a third clock signal, the first, second and third clock signals being non-overlapping clock signals.

18. The peak detector of claim 17, wherein a frequency of the first clock signal and a frequency of the second clock signal establish an attack rate of the peak detector for detecting the peak voltage value of the input signal.

19. The peak detector of claim 17, wherein a frequency of the first clock signal and a frequency of the third clock signal establish a decay rate of the peak detector for decreasing the output voltage of the peak detector.

20. The peak detector of claim 17, wherein the third clock signal is the same as the second clock signal.

21. The peak detector of claim 17, wherein the third clock signal is asserted once for every M pulses of the second clock signal, where M is greater than 1.

22. The peak detector of claim 15, wherein a ratio of the capacitance of the first capacitor to the third capacitor establishes an attack rate of the peak detector for detecting the peak voltage value of the input signal.

23. The peak detector of claim 15, wherein a ratio of the capacitance of the second capacitor to the third capacitor establishes a decay rate of the peak detector for decreasing the output voltage of the peak detector.

24. The peak detector of claim 15, wherein the reference potential is the ground potential at the ground node.

25. A method for detecting the peak voltage value of an input signal, comprising:

sampling the input signal at a first sample rate;

rectifying the sampled input signal;

detecting the peak voltage value of the rectified input signal by storing charge indicative of the rectified input signal on a first charge storage device;

sampling the peak voltage value stored on the first charge storage device onto a second charge storage device at a second sample rate, the second charge storage device having a charge storage capability greater than that of the first charge storage device and the first sample rate and the second sample rate being non-overlapping, wherein the sampling of the peak voltage value onto a second charge storage device generates an output voltage at the second charge storage device indicative of the peak voltage value of the input signal;

selectively coupling a third charge storage device to the second charge storage device at a third sample rate, the second charge storage device having a charge storage capability greater than that of the third charge storage device, wherein the coupling decreases the output voltage at the second charge storage device; and selectively discharging the third charge storage device to a reference potential at a fourth sample rate, the fourth sample rate and the third sample rate being non-overlapping.

26. The method of claim 25, wherein the sampling the peak voltage value stored on the first charge storage device onto a second charge storage device at a second sample rate comprises:

coupling a switch between the first charge storage device and the second charge storage device; and closing the switch to redistribute charge stored on the first charge storage device between the first charge storage device and the second charge storage device.

27. The method of claim 25, wherein the first sample rate is the same as the fourth sample rate.

28. The method of claim 25, wherein the third sample rate is the same as the second sample rate.

29. The method of claim 25, wherein the third sample rate comprises one pulse for every M pulses of the second sample rate, where M is greater than 1.

* * * * *